United States Patent
Moraveji

(10) Patent No.: US 6,940,353 B2
(45) Date of Patent: Sep. 6, 2005

(54) HIGH FREQUENCY POWER AMPLIFIER

(75) Inventor: Farhood Moraveji, Saratoga, CA (US)

(73) Assignee: Micrel, Incorporated, San Jose, CA (US)

( * ) Notice: Subject to any disclaimer, the term of this patent is extended or adjusted under 35 U.S.C. 154(b) by 32 days.

(21) Appl. No.: 10/688,049

(22) Filed: Oct. 16, 2003

(65) Prior Publication Data

US 2005/0083127 A1 Apr. 21, 2005

(51) Int. Cl.$^7$ ................................................ H03F 3/18
(52) U.S. Cl. ...................................... 330/264; 330/267
(58) Field of Search ................................ 330/264, 267, 330/251, 207 A, 269, 270, 271, 273

(56) References Cited

U.S. PATENT DOCUMENTS

| | | | | |
|---|---|---|---|---|
| 4,241,313 A | * | 12/1980 | Takehara | ..................... 330/253 |
| 4,352,073 A | * | 9/1982 | Leuthold | ..................... 330/264 |
| 4,943,784 A | * | 7/1990 | Rybicki | ..................... 330/264 |
| 5,777,516 A | * | 7/1998 | Koifman et al. | ............ 330/277 |
| 6,433,637 B1 | * | 8/2002 | Sauer | ......................... 330/255 |
| 6,836,186 B2 | * | 12/2004 | Lee et al. | ................... 330/264 |

* cited by examiner

Primary Examiner—Henry Choe
(74) Attorney, Agent, or Firm—Bever, Hoffman & Harms, LLP; John M. Kubodera

(57) ABSTRACT

A CMOS amplifier includes a CMOS inverter and a bias circuit coupled in a feedback loop between the output and input of the inverter. The bias circuit provides linear biasing so that the inverter can apply a desired gain to a high frequency input signal. The bias circuit can include an operational amplifier (op-amp) providing positive feedback control between the output and input of the inverter. By providing a reference voltage to the other input of the op-amp, the input of the inverter is regulated such that its output is driven to the reference voltage. This in turn forces the inverter to operate in its linear region, so that the inverter applies non-distorting amplification to the input AC signal. The AC signal is prevented from affecting the operation of the bias circuit by resistors coupling the bias circuit to the op-amp.

17 Claims, 4 Drawing Sheets

US 6,940,353 B2

HIGH FREQUENCY POWER AMPLIFIER

BACKGROUND

1. Field of the Invention

The invention relates to the field of high frequency communications, an in particular to a complementary metal-oxide-semiconductor high frequency amplifier.

2. Related Art

In a conventional high-frequency amplifier, a bipolar transistor (or transistors) is used to provide the desired signal gain, while also providing the responsiveness required to maintain signal integrity. However, as high-frequency amplifiers become more common in consumer goods (e.g., a radio-frequency (RF) amplifier in a cellular telephone), reducing the price of those amplifiers becomes increasingly important. One way to reduce costs is to implement the amplifier using a metal-oxide-semiconductor (MOS) or complementary MOS (CMOS) process instead of the more expensive bipolar process.

FIG. 1 shows a conventional MOS RF amplifier 100. MOS amplifier 100 includes an input terminal 101, an output terminal 102, capacitors C1 and C2, resistors R_UP, R_DN, and R_SET, and an NMOS transistor 110. Capacitor C1 is coupled between input terminal 101 and the gate of transistor 110, while capacitor C_OUT is coupled between the drain of transistor 110 and output terminal 102. Resistors R_UP and R_DN are serially coupled between a supply voltage VDD and ground, with the gate of transistor 110 being connected to the junction between the two transistors. Finally, resistor R_SET and transistor 110 are serially coupled between supply voltage VDD and ground.

During operation, an input RF signal V_IN applied to input terminal 101 is filtered of any DC component by capacitor C1 and the AC signal is provided to the gate of transistor 110. Meanwhile, resistors R_UP and R_DN form a voltage divider that applies a bias voltage to the gate of transistor 110. By properly sizing resistors R_UP and R_DN, the bias voltage can be sized such that transistor 110 operates in its linear region in response to the AC signal from capacitor C1. Consequently, transistor 110 can apply gain without clipping or otherwise distorting the signal (so long as the input signal is not large enough to force transistor 110 into its saturated region).

In response to the AC signal at its gate, transistor 110 adjusts the magnitude of the current flow through resistor R_SET, which in turn generates an output signal at the source of transistor 110. Since the voltage drop across resistor R_SET is equal to the current flow times the resistance of resistor R_SET, the range of the output signal at the source of transistor 110 can be set by selecting an appropriate resistance for resistor R_SET. Increasing or decreasing the resistance of resistor R_SET increases or decreases, respectively, the output range of amplifier 100.

The amplified output signal at the source of transistor 110 is then filtered by capacitor C2 of any DC component that might have been introduced during the amplification process. The AC signal is then provided as an output signal V_OUT at output terminal 102.

In this manner, amplifier 100 provides a relatively simple means for RF amplification using a CMOS implementation. However, because current is always flowing through the voltage divider formed by resistors R_UP and R_DN, amplifier 100 can exhibit excessive power consumption. This power inefficiency is generally undesirable, and can be particularly problematic in devices that run off of a self-contained power supply (a battery). For example, using amplifier 100 in a cellular telephone to reduce the overall cost of the phone may result in an unacceptable decrease in talk time for that phone.

Accordingly, it is desirable to provide a power-efficient, high frequency CMOS amplifier.

SUMMARY OF THE INVENTION

According to an embodiment of the invention, a high-frequency amplifier includes a CMOS inverter and a bias circuit. The CMOS inverter applies a gain to an input signal based on the transconductance and output impedance values of the transistors making up the inverter. Meanwhile, the bias circuit applies linear biasing to the CMOS inverter.

The bias circuit provides a DC bias voltage to the input of the inverter that forces the output of the inverter to be centered on a desired DC operating voltage. By selecting the DC bias voltage to be between the upper and lower supply voltages, the inverter can be forced to operate in its linear region. An AC (alternating current) signal at the input of the inverter will then be amplified by the inverter without distortion (clipping), so long as the amplitude of the AC signal is not large enough to drive the inverter out of its linear region.

According to an embodiment of the invention, the bias circuit includes an operational amplifier (op-amp) and a reference voltage source. The op-amp is connected in a feedback loop between the output of the inverter and the input of the inverter. The reference voltage source provides a reference voltage to the non-inverting input of the op-amp. The op-amp therefore adjusts the input voltage of the inverter in an effort to regulate the output of the inverter to be equal to the reference voltage.

This DC control provided by the op-amp ensures that the inverter will operate in its linear region as long as the input signal is not large enough to push either of the transistors of the inverter into saturation. Therefore, by setting the reference voltage midway between the upper and lower supply voltages, the output range of the amplifier can be maximized.

These and other aspects of the invention will be more fully understood in view of the following description of the exemplary embodiments and the drawings thereof.

DETAILED DESCRIPTION

Figure 2A:
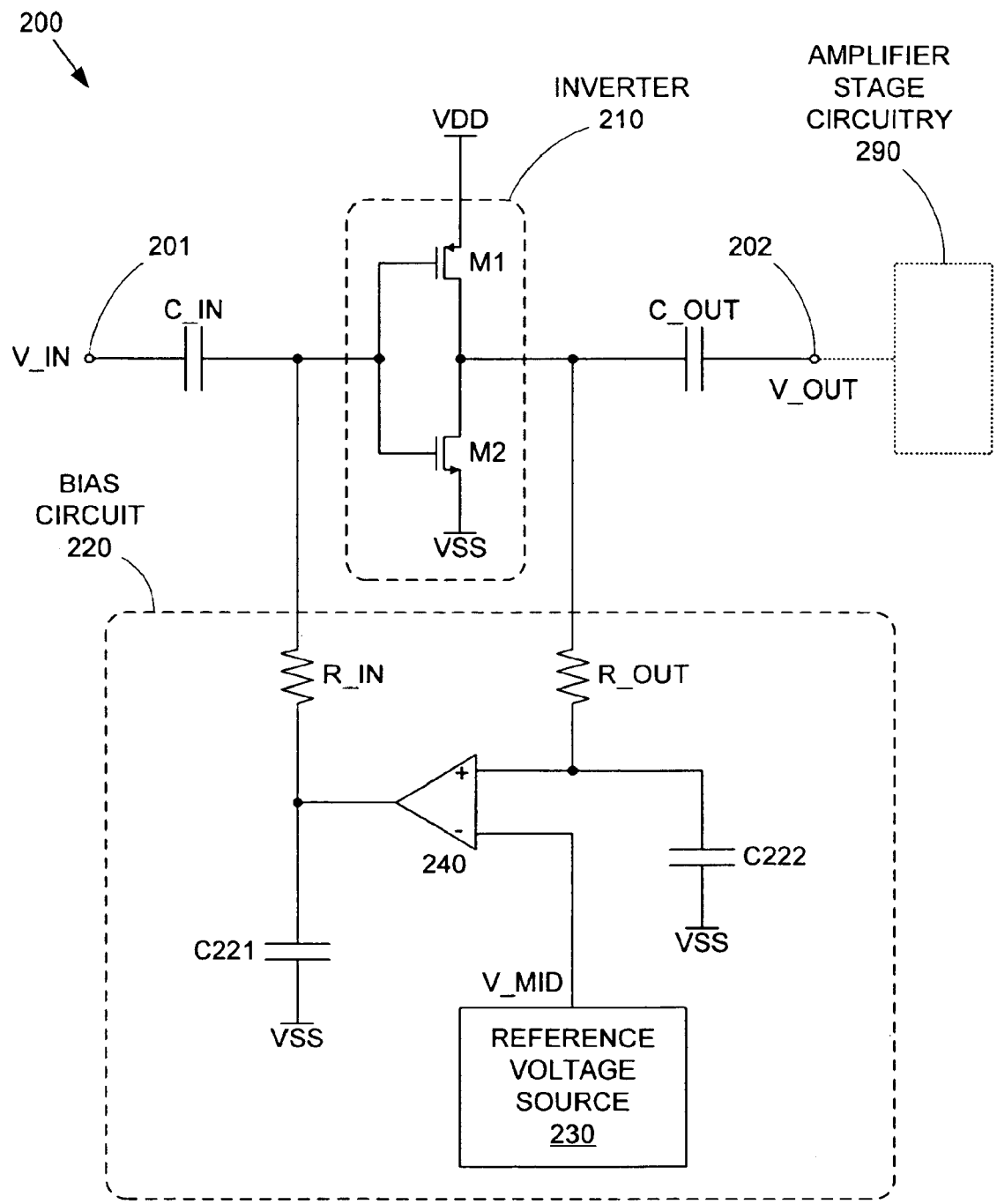
FIG. 2A is a schematic diagram of a CMOS high-frequency amplifier circuit in accordance with an embodiment of the invention.

FIG. 2A shows a high-frequency amplifier circuit 200 in accordance with an embodiment of the invention. Amplifier circuit 200 includes an input terminal 201, an output terminal 202, a CMOS inverter 210, a capacitor C_IN, a capacitor C_OUT, and a bias circuit 220. Capacitor C_IN is coupled between input terminal 201 and the input of inverter 210, while capacitor C_OUT is coupled between the output of inverter 210 and output terminal 202. Bias circuit 220 is connected between the output and input of inverter 210.

Inverter 210 includes a PMOS transistor M1 and an NMOS transistor M2 that are serially coupled between an upper supply voltage VDD and a lower supply voltage VSS (e.g., ground). The gate terminals of transistors M1 and M2 are connected to form the input of inverter 210, while the drain terminals of transistors M1 and M2 are connected to form the output of inverter 210.

Amplifier circuit 200 is coupled to receive an input high-frequency signal V_IN at input terminal 201. High-frequency signal V_IN can, for example, comprise an RF signal. Capacitor C_IN blocks the DC component of input signal V_IN and passes the AC component to inverter 210 (i.e., capacitor C_IN filters out DC components from input signal V_IN).

Meanwhile, bias circuit 220 provides a feedback loop between the output and input of inverter 210 that applies linear biasing to the input of inverter 210. In other words, bias circuit 220 provides a DC bias voltage to the input of inverter 210 that causes inverter 210 to operate in its linear region. The DC bias voltage drives a DC operating voltage at the output of inverter 210 to a nominal voltage (a voltage in the absence of an AC signal) between the upper and lower supply voltages of amplifier circuit 200.

Figure 2B:
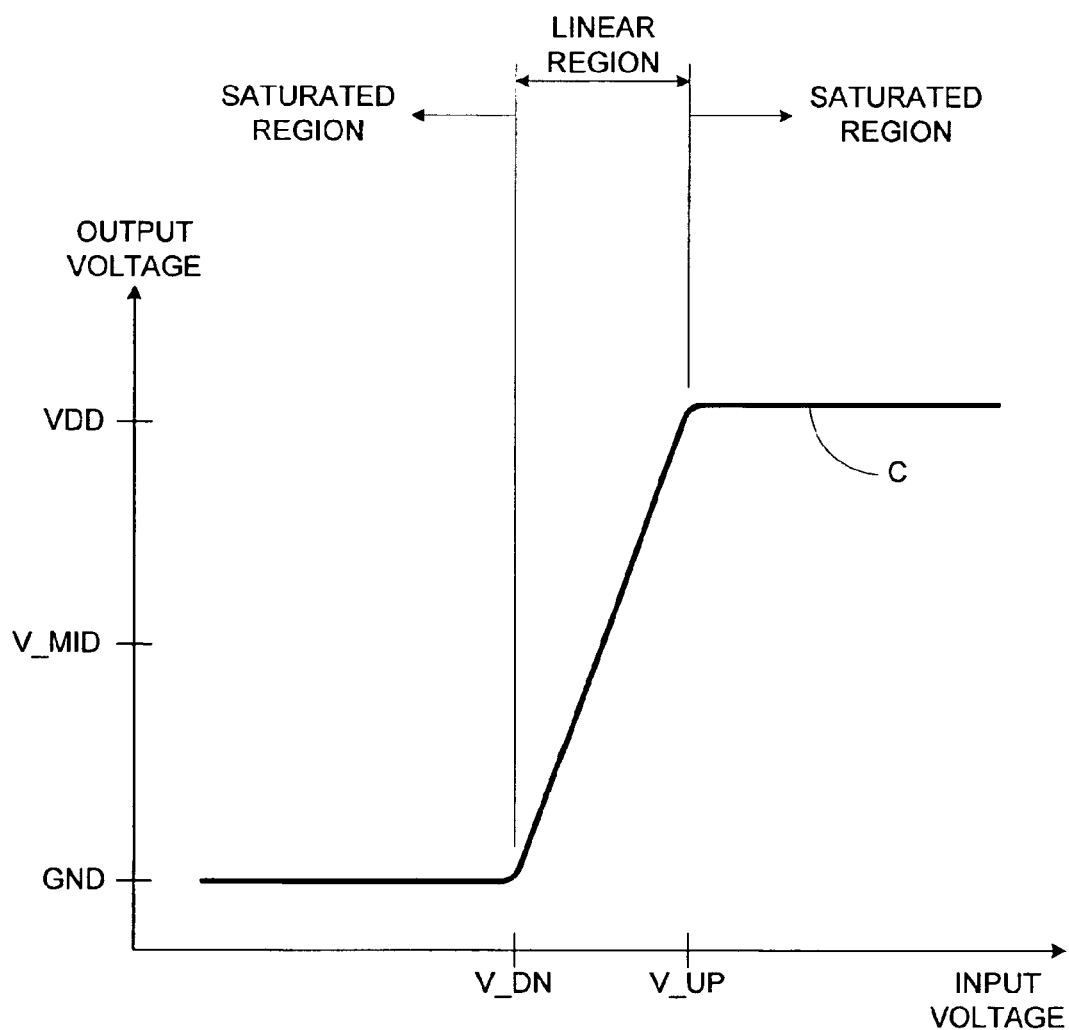
FIG. 2B is a sample graph of the response curve of an inverter, depicting the linear and saturated regions of operation of the inverter.

FIG. 2B shows an exemplary response curve C for inverter 210. Response curve C consists of two main regions—a saturated region that corresponds to all input voltages less than a lower limit voltage V_DN or greater than an upper limit voltage V_UP, and a linear region that corresponds to all input voltages between voltages V_DN and V_UP. Because the normal use of an inverter is to invert a logic LOW or HIGH input signal into a logic HIGH or LOW output signal, respectively, an inverter is generally operated in its saturated region, and will only incidentally pass through its linear region as its output switches between logic LOW (GND) and logic HIGH (VDD).

However, the linear biasing provided by bias circuit 220 forces inverter 210 to operate in its linear region, so that inverter 210 can be used to provide signal amplification. Specifically, the DC bias voltage supplied by bias circuit 220 shifts the nominal inverter input voltage (i.e., the voltage at the input of the inverter when no AC signal is present) to a level between lower limit voltage V_DN and upper limit voltage V_UP. An AC input signal will therefore swing around this nominal DC input voltage, thereby ensuring that inverter 210 provides an AC output signal that is an amplified value of the AC input signal (so long as the AC input signal amplitude does not exceed lower limit voltage V_DN or upper limit voltage V_UP).

Returning to FIG. 2A, according to an embodiment of the invention, bias circuit 220 includes resistors R_IN and R_OUT, optional capacitors C221 and C222, a reference voltage source 230, and an operational amplifier (op-amp) 240. Resistor R_IN is connected between the input of inverter 210 and the output of op-amp 240, while resistor R_OUT is connected between the output of inverter 210 and the non-inverting input of op-amp 240. Capacitor C221 is connected between the output of op-amp 240 and lower supply voltage VSS, while capacitor C222 is connected between the non-inverting input of op-amp 240 and lower supply voltage VSS. Finally, reference voltage source 230 is connected to the inverting input of op-amp 240.

Reference voltage source 230 provides a reference voltage V_MID to the inverting input of op-amp 240. Meanwhile, the voltage at the output of inverter 210 is provided to the non-inverting input of op-amp 240 (via resistor R_OUT). Therefore, if the voltage at the output of inverter 210 is less than reference voltage V_MID, op-amp 240 decreases its output voltage (and hence the voltage provided at the input of inverter 210), thereby raising the output of inverter 210. Similarly, if the voltage at the output of inverter 210 is greater than reference voltage V_MID, op-amp 240 increases its output voltage to decrease the output of inverter 210.

In this manner, op-amp 240 regulates a DC bias voltage at the input of inverter 210 (via resistor R_IN) to force the output of inverter 210 to swing around a DC operating voltage that is equal to reference voltage V_MID. This DC biasing of the input of inverter 210 forces inverter 210 to operate in its linear mode, so that gain can be applied to a signal provided to inverter 210 without distortion (clipping). Note that, while reference voltage V_MID can be set to any value between upper supply voltage VDD and lower supply voltage VSS, the maximum output range of amplifier circuit 200 will be provided by setting reference voltage V_MID halfway between upper supply voltage VDD and lower supply voltage VSS (i.e., V_MID=(VDD−VSS)/2).

Note further, that it is desirable that the linear biasing provided by bias circuit 220 not be affected by (or affect) the AC signal being amplified by amplifier circuit 200. Accordingly, bias circuit 220 includes both resistors R_IN and R_OUT and capacitors C221 and C2222. Resistors R_IN and R_OUT effectively isolate op-amp 240 from any AC signals that are provided to or generated by inverter 210 by suppressing the bulk of those signals before they reach op-amp 240. Meanwhile, optional capacitors C221 and C222 can provide a direct path to lower supply voltage VSS for any AC that does get by resistors R_IN and R_OUT, respectively, or is generated by op-amp 240.

Figure 1:
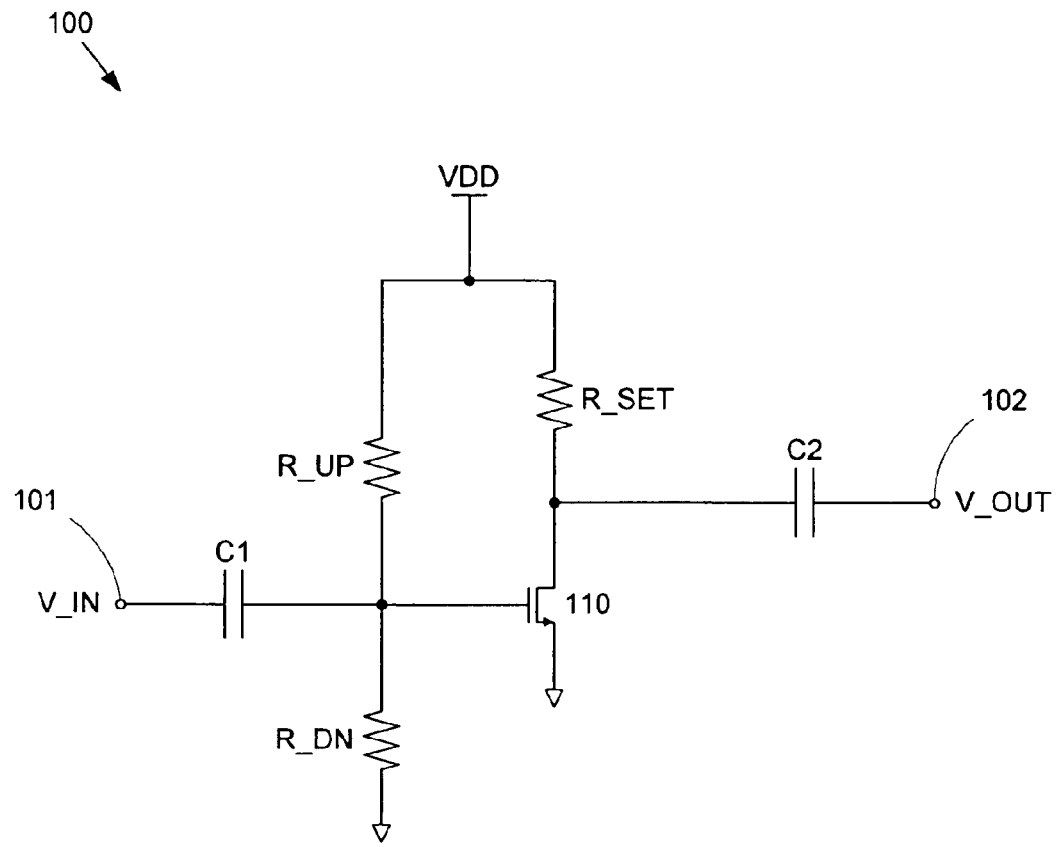
FIG. 1 is a schematic diagram of a conventional CMOS RF amplifier.

Practitioners will readily appreciate that because bias circuit 220 does not require the resistive divider (voltage divider) of conventional amplifier 100 shown in FIG. 1, the power consumption of amplifier circuit 200 shown in FIG. 2 can be reduced relative to the power consumption of amplifier 100.

Because of the linear biasing provided by bias circuit 220, inverter 210 can provide a significant amount of gain (while operating in its linear region). The actual gain provided by inverter 210 is given by the following equation:

$$G=(g_{m1}+g_{m2})*(Ro_1||Ro_2) \quad (1)$$

where $g_{m1}$ and $g_{m2}$ are the transconductances of transistors M1 and M2, respectively, and $Ro_1$ and $Ro_2$ are the output resistances of transistors M1 and M2, respectively.

The term "$Ro_1||Ro_2$" represents the parallel resistance of Ro1 and Ro2, and resolves to the equation:

$$Ro_1||Ro_2=(Ro_1*Ro_2)/(Ro_1+Ro_2) \quad (2)$$

Substituting equation (2) into equation (1) therefore yields a gain equation of:

$$G=(g_{m1}+g_{m2})/(Y_1+Y_2) \quad (3)$$

where $Y_1$ is equal to $1/Ro_1$ and $Y_2$ is equal to $1/Ro_2$.

The transconductance of a transistor represents the relationship between drain current and gate-source voltage in the transistor, and therefore indicates the gain provided by the transistor. The higher the transconductance, the more gain the transistor provides.

In a MOS transistor, the transconductance is proportional to the aspect ratio (width/length) of the gate. Therefore, by adjusting the gate dimensions of transistors M1 and M2, the gain provided by amplifier circuit 200 can be adjusted.

For example, according to an embodiment of the invention, upper supply voltage VDD can be 1.8V, reference voltage V_MID can be set to 0.9V, and lower supply voltage VSS can be ground. Transistor M1 can then have an aspect ratio of 27/0.35, transistor M2 can have an aspect ratio of 21.6/0.35, resistors R_IN and R_OUT can have resistances of 1.5 kΩ each, and capacitors C_IN and C_OUT can have capacitances of 150 fF each. Amplifier circuit 200 can then provide between 10–15 dB of RF gain.

Note that while described as a standalone circuit for exemplary purposes, amplifier circuit 200 can comprise a stage in a series of cascaded amplifier stages, or a predriver for additional amplifier circuitry, as indicated by optional (dotted line) amplifier stage circuitry 290.

Figure 3:
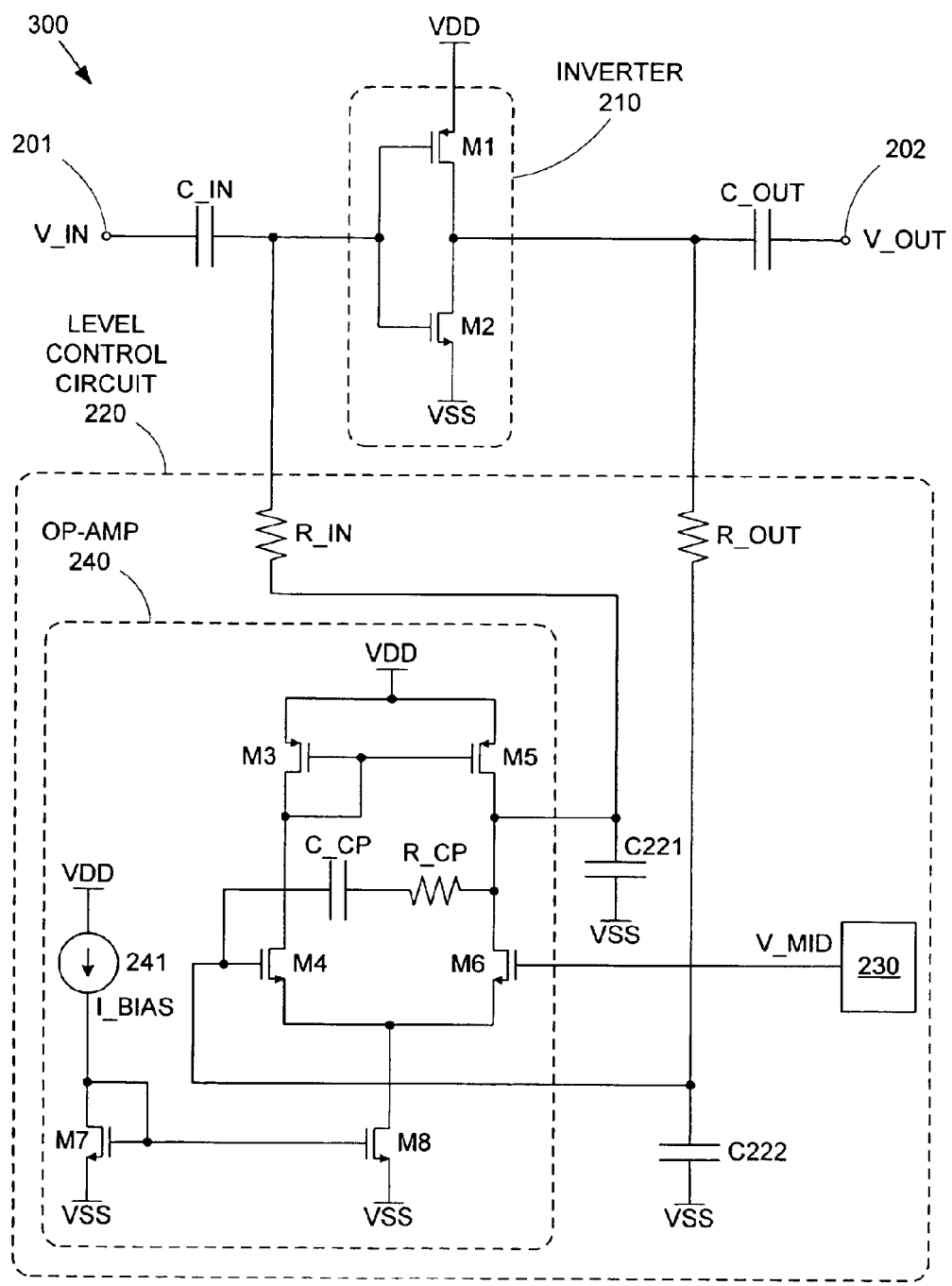
FIG. 3 is a schematic diagram of the CMOS high-frequency amplifier circuit of FIG. 2A that includes a detail view of a schematic for an operational amplifier in accordance with an embodiment of the invention.

FIG. 3 shows another schematic view of high-speed amplifier circuit 200 that depicts a schematic diagram for op-amp 240, according to an embodiment of the invention. Op-amp 240 includes transistors PMOS transistors M3 and M5, NMOS transistors M4, M6, M7, and M8, a current source 241, a capacitor C_CP, and a resistor R_CP.

Transistors M3 and M4 are connected in series between upper supply voltage VDD and transistor M8, and transistors M5 and M6 are connected in series between upper supply voltage VDD and transistor M8. Transistor M8 is coupled between transistor M4 and lower supply voltage VSS, and current source 241 and transistor M7 are connected in series between upper supply voltage VDD and lower supply voltage VSS. Finally, capacitor C_CP and resistor R_CP are connected in series between the gate of transistor M4 and the drain of transistor M6.

The gate of transistor M4 forms the non-inverting input of op-amp 240, and is accordingly coupled to the input of inverter 210 via resistor R_OUT. Meanwhile, the gate of transistor M6 forms the inverting input of op-amp 240, and is therefore coupled to reference voltage circuit 230. And the junction between transistors M5 and M6 forms the output of op-amp 240, and is therefore coupled to the input of inverter 210 via resistor R_IN.

Thus, capacitor C_CP and resistor R_CP are coupled between the non-inverting input and the output of op-amp 240. Capacitor C_CP and resistor R_CP form a compensation circuit that improves the stability of op-amp 240 by preventing unwanted oscillations. Note that various other op-amp compensation circuits will be readily apparent.

The gate and drain of transistor M7 are shorted, and the gates of transistors M7 and M8 are connected to form a current mirror. Therefore, a current I_BIAS from current source 241 that is sunk by transistor M7 is also mirrored by transistor M8. Therefore, a total current I_BIAS flows through the two branches formed by transistors M3 and M4 (first branch) and by transistors M5 and M6 (second branch).

Meanwhile, the gate and drain of transistor M3 are shorted, and the gates of transistors M3 and M5 are connected to form another current mirror that provides a load for the differential pair formed by transistors M4 and M6. When the gate voltages provided to transistors M4 and M6 (i.e., the inputs to op-amp 240) are the same, transistors M3 and M5 split the flow of current I_BIAS equally through transistors M4 and M6. However, when the gate voltages of transistors M4 and M6 are different, transistor M5 adjusts its drain voltage (i.e., the output of op-amp 240) in response.

For example, if the voltage provided at the gate of transistor M4 (i.e., the voltage at the output of inverter 210) is greater than the voltage provided at the gate of transistor M6 (i.e., reference voltage V_MID), then transistor M4 is turned on more strongly than transistor M6, and the current flow through transistor M4 increases. Since the total current flow through transistors M4 and M6 is fixed at current I_BIAS by transistor M8, this increase in current flow through transistor M4 means that the current flow through transistor M6 must decrease.

To provide this current reduction, the drain voltage of transistor M6 is increased. This has the effect of reducing the gate-drain voltage of transistor M6, which in turn reduces the current flow through transistor M6. Meanwhile, this increased drain voltage of transistor M6 is applied to the input of inverter 210 (via resistor R_IN), thereby driving the voltage at the output of inverter 210 down towards reference voltage V_MID.

Similarly, if the voltage provided at the gate of transistor M4 is less than the voltage provided at the gate of transistor M6, then transistor M4 is turned on less strongly than transistor M6, and the current flow through transistor M4 decreases. Therefore, the current flow through transistor M6 must increase, and the drain voltage of transistor M6 is decreased to increase the gate-drain voltage of transistor M6. This decreased drain voltage of transistor M6 is applied to the input of inverter 210, thereby driving the voltage at the output of inverter 210 up towards reference voltage V_MID.

Of course, the circuitry shown for op-amp 240 in FIG. 3 is exemplary only. Alternatives may be found in the conventional art.

The various embodiments of the structures and methods of this invention that are described above are illustrative only of the principles of this invention and are not intended to limit the scope of the invention to the particular embodiments described. Thus, the invention is limited only by the following claims and their equivalents.

What is claimed is:

1. An amplifier circuit comprising:
   a first input terminal;
   a first output terminal;
   a first complementary metal-oxide-semiconductor (CMOS) inverter coupled between the first input terminal and the first output terminal; and
   a first bias circuit for applying linear biasing to an input of the first CMOS inverter, the first bias circuit being coupled between an output of the first CMOS inverter and the input of the first CMOS inverter,
   wherein the first CMOS inverter comprises:
      a p-type metal-oxide-semiconductor (PMOS) transistor; and
      an n-type metal-oxide-semiconductor (NMOS) transistor,
      wherein the PMOS transistor and the NMOS transistor are serially connected between an upper supply voltage and a lower supply voltage,
      wherein a gate of the PMOS transistor and a gate of the NMOS transistor are connected to the input of the first CMOS inverter,
      wherein a drain of the PMOS transistor and a drain of the NMOS transistor are connected to the output of the first CMOS inverter, and
      wherein the first bias circuit comprises an operational amplifier, wherein a non-inverting input of the op-amp is coupled to the output of the first CMOS inverter, wherein an output of the op-amp is coupled to the input of the first CMOS inverter, and wherein an inverting input of the op-amp is coupled to receive a reference voltage, the reference voltage being between the first supply voltage and the second supply voltage, the first supply voltage being greater than the second supply voltage.

2. The amplifier circuit of claim 1, wherein the reference voltage is halfway between the first supply voltage and the second supply voltage.

3. The amplifier circuit of claim 1, wherein the non-inverting input of the op-amp is coupled to the output of the first CMOS inverter by a first resistor, and
wherein the output of the op-amp is coupled to the input of the first CMOS inverter by a second resistor.

4. The amplifier circuit of claim 3, wherein the non-inverting input of the op-amp is coupled to the second supply voltage by a first capacitor, and
wherein the output of the op-amp is coupled to the second supply voltage by a second capacitor.

5. amplifier circuit comprising:
a first input terminal;
a first output terminal;
a first complementary metal-oxide-semiconductor (CMOS) inverter coupled between the first input terminal and the first output terminal;
a first bias circuit for applying linear biasing to an input of the first CMOS inverter, the first bias circuit being coupled between an output of the first CMOS inverter and the input of the first CMOS inverter; and
an amplifier stage coupled to the first output terminal, wherein the amplifier stage comprises:
a second input terminal coupled to the first output terminal;
a second output terminal;
a second CMOS inverter coupled between the second input terminal and the second output terminal; and
a second bias circuit for applying linear biasing to an input of the second CMOS inverter, the second bias circuit being coupled between an output of the second CMOS inverter and the input of the second CMOS inverter.

6. A method for operating a high frequency amplifier, the method comprising:
providing a complementary metal-oxide-semiconductor (CMOS) inverter having an inverter input and an inverter output;
applying linear biasing to the inverter input; and
supplying an alternating current (AC) signal to the inverter input to generate an amplified AC signal,
wherein applying linear biasing to the inverter input comprises monitoring a direct current (DC) operating voltage at the inverter output and supplying a DC bias voltage to the inverter input to drive the DC operating voltage to a reference voltage,
wherein monitoring the DC operating voltage comprises providing the DC operating voltage to a non-inverting input of an operational amplifier (op-amp), and
wherein supplying the DC bias voltage comprises providing the reference voltage to an inverting input of the op-amp and providing an op-amp output voltage to the inverter input.

7. The method of claim 6, wherein providing the DC operating voltage to the non-inverting input of the op-amp comprises coupling the inverter output to the non-inverting input of the op-amp via a first resistor, and
wherein providing the op-amp output voltage to the inverter input comprises coupling an output of the op-amp to the inverter input via a second resistor.

8. The method of claim 7, wherein the CMOS inverter comprises a PMOS transistor and an NMOS transistor serially connected between an upper supply voltage and a lower supply voltage, and
wherein the reference voltage is halfway between the upper supply voltage and the lower supply voltage.

9. The method of claim 8, wherein the op-amp output voltage to the inverter input further comprises coupling the output of the op-amp to the lower supply voltage via a first capacitor, and
wherein providing the DC operating voltage to the non-inverting input of the op-amp further comprises coupling the non-inverting input of the op-amp to the lower supply voltage via a second capacitor.

10. The method of claim 8, wherein supplying the AC signal to the inverter input comprises:
receiving a high frequency input signal; and
filtering out DC components from the high frequency input signal to generate the AC signal.

11. The method of claim 10, further comprising:
filtering out DC components from the amplified AC signal to generate an output AC signal; and
supplying the output AC signal to an amplifier gain stage.

12. A high frequency amplifier comprising:
a complementary metal-oxide-semiconductor (CMOS) inverter; and
means for regulating a DC bias voltage at an input of the CMOS inverter to force a DC operating voltage at an output of the CMOS inverter to a reference voltage,
wherein the CMOS inverter comprises:
a p-type metal-oxide-semiconductor (PMOS) transistor, wherein a gate of the PMOS transistor is connected to the input of the CMOS inverter, and
wherein a drain of the PMOS transistor is connected to the output of the CMOS inverter; and
an n-type metal-oxide-semiconductor (NMOS) transistor, wherein a gate of the NMOS transistor is connected to the input of the CMOS inverter, wherein a drain of the NMOS transistor is connected to the output of the CMOS inverter, wherein the PMOS transistor and the NMOS transistor are serially coupled between an upper supply voltage and a lower supply voltage, and wherein the reference voltage is halfway between the upper supply voltage and the lower supply voltage.

13. A high frequency amplifier comprising:
a complementary metal-oxide-semiconductor (CMOS) inverter; and
means for regulating a DC bias voltage at an input of the CMOS inverter to force a DC operating voltage at an output of the CMOS inverter to a reference voltage,
wherein the CMOS inverter comprises:
a p-type metal-oxide-semiconductor (PMOS) transistor, wherein a gate of the PMOS transistor is connected to the input of the CMOS inverter, and
wherein a drain of the PMOS transistor is connected to the output of the CMOS inverter; and
an n-type metal-oxide-semiconductor (NMOS) transistor, wherein a gate of the NMOS transistor is connected to the input of the CMOS inverter, wherein a drain of the NMOS transistor is connected to the output of the CMOS inverter, and wherein the PMOS transistor and the MMOS transistor are serially coupled between an upper supply voltage and a lower supply voltage, the reference voltage being between the upper supply voltage and the lower supply voltage, and wherein the means for regulating the DC bias voltage comprises:
- a voltage generator for generating the reference voltage; and
- an operation amplifier (op-amp) comprising:
  - a non-inverting input coupled to the output of the CMOS inverter via a first resistor;
  - an inverting input coupled to receive the reference voltage from the voltage generator; and
  - an op-amp output coupled to the input of the CMOS inverter via a second resistor.

14. The high frequency amplifier of claim 13, wherein the means for regulating the DC bias voltage further comprises:
- a first capacitor coupled between the non-inverting input and the lower supply voltage; and
- a second capacitor coupled between the op-amp output and the lower supply voltage.

15. An amplification circuit comprising:
- a complementary metal-oxide-semiconductor (CMOS) inverter coupled between an upper supply voltage and a lower supply voltage; and
- an operational amplifier (op-amp) comprising:
  - a non-inverting input coupled to an output of the CMOS inverter;
  - an inverting input coupled to receive a reference voltage, the reference voltage being between the upper supply voltage and the lower supply voltage; and
  - an output coupled to an input of the CMOS inverter,
  wherein the non-inverting input is coupled to the output of the CMOS inverter by a first resistor, and
  wherein the output of the op-amp is coupled to the input of the CMOS inverter by a second resistor.

16. The amplification circuit of claim 15, wherein the non-inverting input of the op-amp is coupled to the lower supply voltage by a first capacitor, and
wherein the output of the op-amp is coupled to the lower supply voltage by a second capacitor.

17. The amplification circuit of claim 16, further comprising:
- an input terminal coupled to the input of the CMOS inverter by a third capacitor; and
- an output terminal coupled to the output of the CMOS inverter by a fourth capacitor.

* * * * *